(12) United States Patent
Ishida et al.

(10) Patent No.: US 8,629,437 B2
(45) Date of Patent: Jan. 14, 2014

(54) SEMICONDUCTOR DEVICE AND MANUFACTURING METHOD THEREOF

(75) Inventors: Tatsuya Ishida, Oita (JP); Masahiro Inohara, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 369 days.

(21) Appl. No.: 13/051,524

(22) Filed: Mar. 18, 2011

(65) Prior Publication Data
US 2012/0068179 A1    Mar. 22, 2012

(30) Foreign Application Priority Data
Mar. 26, 2010  (JP) ................. P2010-073714

(51) Int. Cl.
*H01L 21/768* (2006.01)
*H01L 29/786* (2006.01)

(52) U.S. Cl.
USPC  257/57; 257/755; 257/E21.585; 257/E29.289; 438/675

(58) Field of Classification Search
USPC .................... 257/57, 755, E29.289, E21.585; 438/675
See application file for complete search history.

(56) References Cited

U.S. PATENT DOCUMENTS

| 4,833,519 | A | * | 5/1989 | Kawano et al. | ............... 257/752 |
| 5,641,991 | A | * | 6/1997 | Sakoh | ........................... 257/755 |
| 6,828,689 | B2 | | 12/2004 | Madurawe | |
| 7,064,018 | B2 | * | 6/2006 | Madurawe | ..................... 438/149 |
| 2008/0258310 | A1 | * | 10/2008 | Fukumoto | ..................... 257/774 |

FOREIGN PATENT DOCUMENTS

| JP | 63-169755 | 7/1988 |
| JP | 08-078519 | 3/1996 |
| JP | 11-260937 | 9/1999 |
| JP | 2005-086157 | 3/2005 |
| JP | 2008-262962 | 10/2008 |

OTHER PUBLICATIONS

Japanese Office Action for Japanese Application No. 2010-073714 mailed on Aug. 3, 2012.
Naito, et al; World's first monolithic 3D-FPGA with TFT SRAM over 90nm 9 layer Cu CMOS; 2010 Symposium on VLSI Technology Digest of Technical Papers, pp. 219-220.

\* cited by examiner

*Primary Examiner* — Julio J Maldonado
*Assistant Examiner* — Daniel Shook
(74) *Attorney, Agent, or Firm* — White & Case LLP (57) ABSTRACT

According to embodiments, there is provided a semiconductor device, including: a logic circuit; an interlayer insulating film formed above the logic circuit; an amorphous silicon layer including: a non-silicide layer formed on the interlayer insulating film; and a silicide layer formed on the non-silicide layer; a TFT formed on the amorphous silicon layer; and a contact plug formed to plug a through hole penetrating the interlayer insulating film, the contact plug being electrically connected to the logic circuit, an upper part of the contact plug being connected to the silicide layer.

7 Claims, 10 Drawing Sheets

SEMICONDUCTOR DEVICE AND MANUFACTURING METHOD THEREOF

CROSS-REFERENCE TO RELATED APPLICATIONS

This application claims priority from Japanese Patent Application No. 2010-073714 filed on Mar. 26, 2010, the entire contents of which are incorporated herein by reference.

FIELD

Embodiments described herein relate generally to a semiconductor device and a manufacturing method thereof.

BACKGROUND

For example, U.S. Pat. No. 7,064,018-B discloses a semiconductor integrated circuit having a logic circuit and a thin film transistor (TFT) circuit provided in a layer above the logic circuit.

In such semiconductor integrated circuit, an interlayer insulating film is formed on the logic circuit, and an amorphous silicon layer is formed on the interlayer insulating film. A TFT circuit is formed using the amorphous silicon layer as an active region. The logic circuit and the TFT circuit are connected by a contact plug penetrating the interlayer insulating film.

If the amorphous silicon layer as an active region of the TFT circuit is connected with the contact plug formed of tungsten (W), electric-resistance therebetween will be high. Consequently, the amorphous silicon layer has fully been silicided to reduce the connection electric-resistance between the active region (fully-silicided amorphous silicon layer) of the TFT circuit and the contact.

However, the adhesiveness between the fully-silicided amorphous silicon layer and the interlayer insulating film (on which the amorphous silicon layer is formed) is low. If the amorphous silicon layer is fully silicided, the fully-silicided amorphous silicon layer may peel off the interlayer insulating film, and the yield of the device may be reduced.

DETAILED DESCRIPTION

According to embodiments, there is provided a semiconductor device, including: a logic circuit; an interlayer insulating film formed above the logic circuit; an amorphous silicon layer including: a non-silicide layer formed on the interlayer insulating film; and a silicide layer formed on the non-silicide layer; a TFT formed on the amorphous silicon layer; and a contact plug formed to plug a through hole penetrating the interlayer insulating film, the contact plug being electrically connected to the logic circuit, an upper part of the contact plug being connected to the silicide layer.

Embodiments are described hereinafter with reference to the drawings.

Embodiment 1

Figure 1:
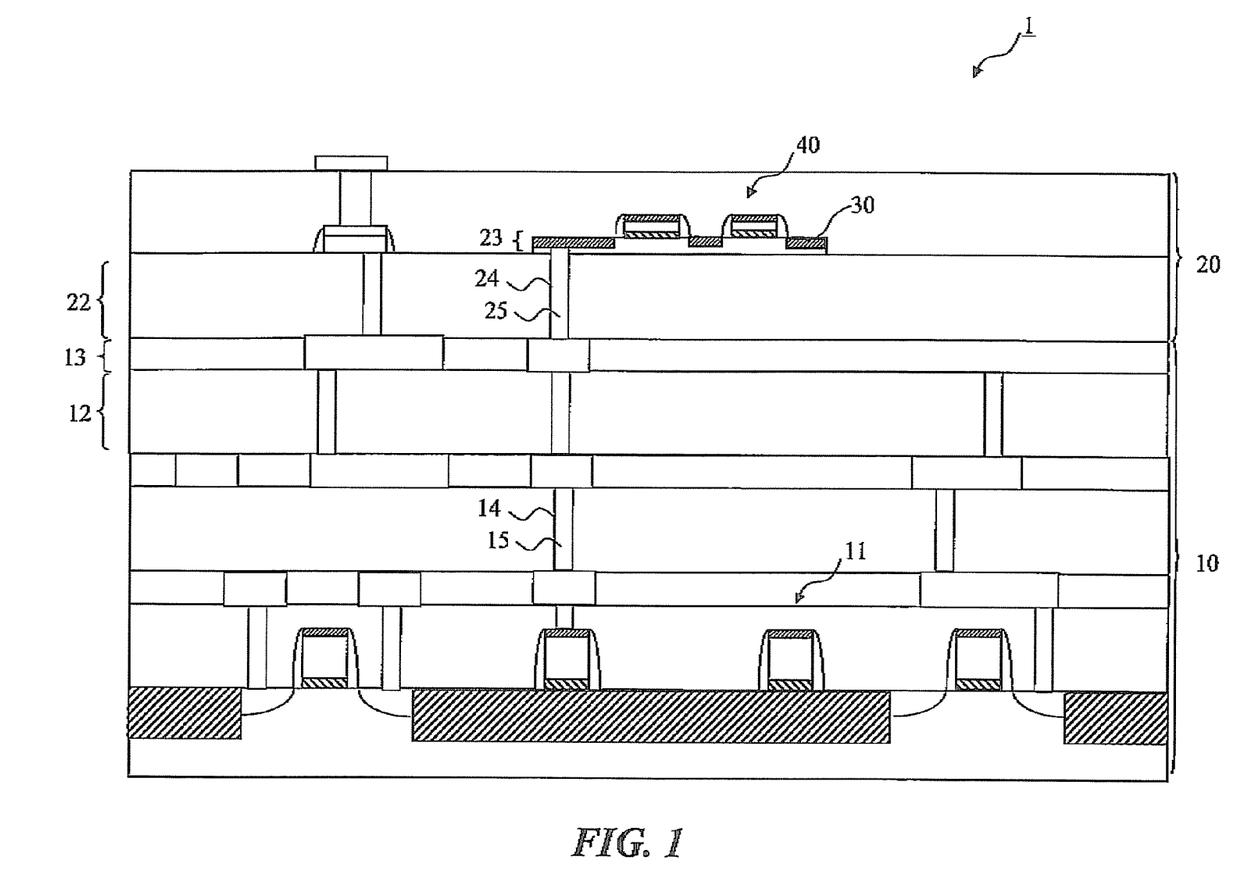
FIG. 1 is a cross-sectional view generally illustrating a semiconductor device according to an embodiment.

FIG. 1 is a cross-sectional view generally illustrating a semiconductor device according to embodiments.

As illustrated in FIG. 1, a semiconductor device 1 includes a logic circuit 10, and a TFT circuit 20 formed thereabove.

The logic circuit 10 includes a transistor 11 formed on a semiconductor substrate. The logic circuit 10 further includes plural interlayer insulating films 12 formed on the transistor 11, plural wiring layers 13 and plural contact plugs 15. The interlayer insulating film 12 has through holes 14 penetrating therethrough, and the contact plugs 15 are respectively plugged therein to electrically connect between the wiring layers 13.

The TFT circuit 20 is formed above the logic circuit 10. The TFT circuit 20 includes an interlayer insulating film 22 formed above the logic circuit 10, an amorphous silicon layer 23 formed on the interlayer insulating film 22, a TFT 40 formed on the amorphous silicon layer 23, and a contact plug 25 plugging a through hole 24 penetrating the interlayer insulating film 22 to electrically connect between the logic circuit 10 and the amorphous silicon layer 23. As described in detail below, the amorphous silicon layer 23 includes a silicide layer 30 which is silicided from the top-part thereof to a predetermined depth. And, the top-part of the contact plug 25 is contacted with the silicide layer 30 of the amorphous silicon layer 23.

Figure 2:
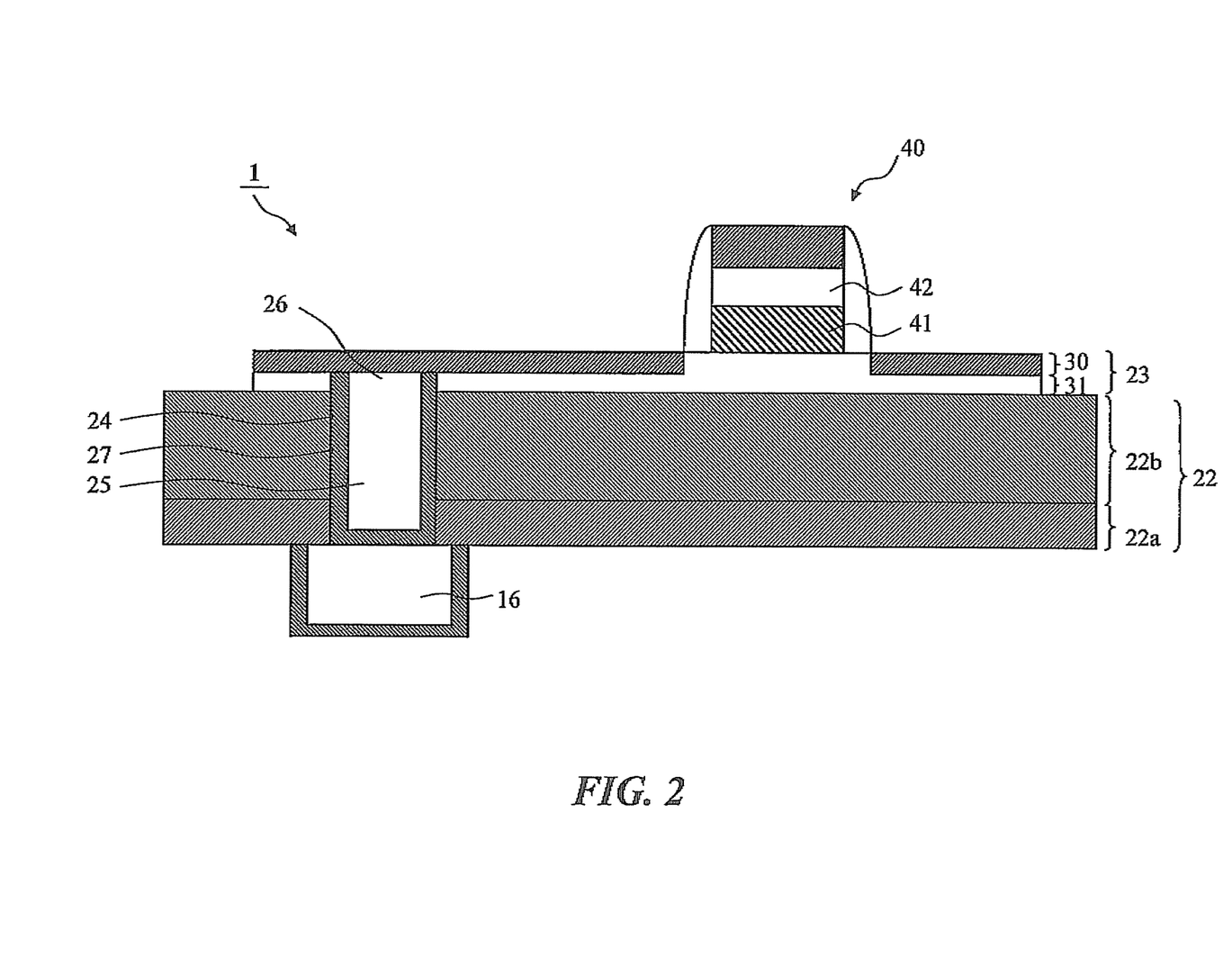
FIG. 2 is a cross-sectional view partially illustrating a semiconductor device according to Embodiment 1.

Next, the TFT circuit 20 is described in more detail with reference to FIG. 2. FIG. 2 is a cross-sectional view partially illustrating a semiconductor device according to Embodiment 1. FIG. 2 illustrates the TFT circuit 20 in FIG. 1, and the wiring layer 13 formed under the TFT circuit 20.

The wiring 16 of the wiring layer 13 is, e.g., copper wiring. The interlayer insulating film 22 formed on the wiring layer 13 includes, e.g., a silicon nitride (SiN) film 22a and a tetra-ethoxysilane (TEOS) film 22b.

An amorphous silicon layer 23 is formed on the interlayer insulating film 22. The amorphous silicon layer 23 includes the silicide layer 30 silicided from the top-part thereof to a predetermined depth. The thickness of the amorphous silicon layer 23 is about, e.g., 50 nanometers (nm) to 60 nm. The thickness of the silicide layer 30 is about, e.g., 15 nm to 30 nm. Thus, the amorphous silicon layer 23 includes an upper part silicided into the silicide layer 30 and a lower part remained (left not silicided) as a non-silicide layer 31. Consequently, the amorphous silicon layer 23 is connected to the interlayer insulating film 22 at the non-silicide layer 31 thereof. Thus, in the present embodiment, the adhesiveness between the amorphous silicon layer 23 and the interlayer insulating film 22 is high, as compared with a case where a silicided (fully-silicided) amorphous silicon is connected to an interlayer insulating film. Accordingly, the amorphous silicon layer 23 can be prevented from being peeled from the interlayer insulating film 22.

A TFT 40 is formed on the amorphous silicon layer 23. The TFT 40 is formed using the amorphous silicon layer 23 as an active region. The gate insulating film 41 of the TFT 40 is made of, e.g., a TEOS film. The gate electrode 42 thereof is made of, e.g., an amorphous silicon whose upper part is silicided. The channel region of the TFT 40 is made of an amorphous silicon which is not silicided.

The contact plug 25 is formed to plug the through hole 24 penetrating through the interlayer insulating film 22. The contact plug 25 is formed in the through hole 24 via a barrier metal 27. The contact plug 25 is made of, e.g., tungsten. The bottom-part of the contact plug 25 is connected to the wiring 16 via the barrier metal 27. Consequently, the contact plug 25 is electrically connected to the logic circuit 10. In addition, the top-part of the contact plug 25 is connected to the silicide layer 30. The contact plug 25 plugs the through hole 24 and has a protrusion portion 26 protruded therefrom to be connected to the silicide layer 30. Consequently, the interface resistance between the contact plug 25 and the amorphous silicon layer 23 can be reduced.

As described above, in the semiconductor device 1 according to the present embodiment, the amorphous silicon layer 23 includes the silicide layer 30 and the non-silicide layer 31, the non-silicide layer 31 is contacted with the interlayer insulating film 22, and the silicide layer 30 is connected to the contact plug 25. Consequently, the amorphous silicon layer 23 can be prevented from being peeled off the interlayer insulating film 22, while reducing the interface resistance between the amorphous silicon layer 23 and the contact plug 25.

Next, a semiconductor device manufacturing method according to the present embodiment is described hereinafter by referring to FIGS. 3A to 3D. FIGS. 3A to 3D are cross-sectional views illustrating a part of the semiconductor device manufacturing method according to Embodiment 1.

Figure 3A:
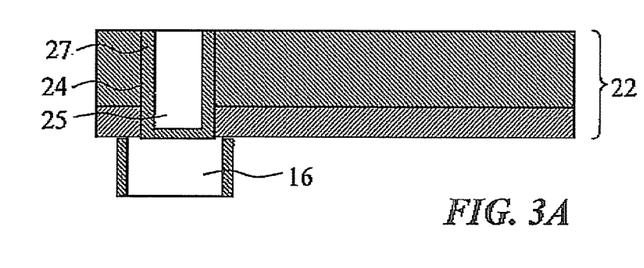
FIGS. 3A to 3D are cross-sectional views illustrating a part of a semiconductor device manufacturing method according to Embodiment 1

First, as illustrated in FIG. 3A, the through hole 24 is formed in the interlayer insulating film 22 to penetrate therethrough and to expose the wiring 16 at the bottom thereof, after the interlayer insulating film 22 is formed above a logic circuit (not shown) by a conventional method. Next, after the barrier metal 27 is formed in the through hole 24 by a conventional method, the contact plug 25 is formed by a chemical vapor deposition (CVD) method or the like to plug the through hole 24.

Figure 3B:
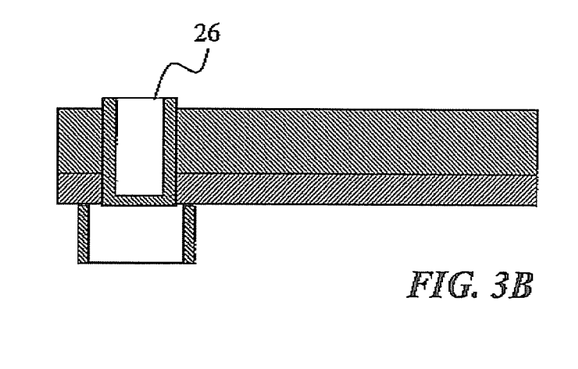

Next, as illustrated in FIG. 3B, the interlayer insulating film 22 and the barrier metal 27 are planarized by chemical-mechanical polishing (CMP). Then, the interlayer insulating film 22 is selectively etched by a predetermined thickness through wet-etching or dry-etching. The predetermined thickness is, e.g., about 40 nm. Consequently, the contact plug 25 has the protrusion portion 26 protruding from the through hole 24 in the interlayer insulating film 22.

Figure 3C:
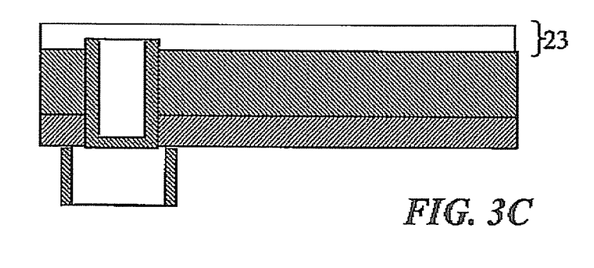

Next, as illustrated in FIG. 3C, the amorphous silicon layer 23 is formed on the interlayer insulating film 22 and the contact plug 25. The amorphous silicon layer 23 formed in this stage is, e.g., about 50 nm to 60 nm.

Figure 3D:
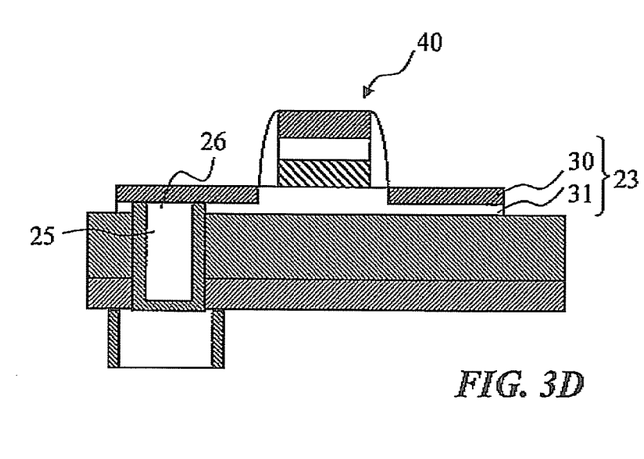

Next, as illustrated in FIG. 3D, the TFT 40 is formed on the amorphous silicon layer 23 by a conventional method, such as the CVD method, or a lithography method. Then, the amorphous silicon layer 23 is silicided from the top-part thereof to a predetermined depth. At that time, the film thickness of a metal (e.g., nickel (Ni), titanium (Ti), or cobalt (Co)) to be sputtered is adjusted. Thus, the amorphous silicon layer 23 can be silicided from the top-part thereof to the predetermined depth. Consequently, the top-part of the amorphous silicon layer 23 is silicided into the silicide layer 30, while the bottom-part thereof is remained (left not silicided) as a non-silicide layer 31. Accordingly, the silicide layer 30 is connected to the protrusion portion 26 of the contact plug 25.

According to the above manufacturing method, a semiconductor device is manufactured such that the amorphous silicon layer 23 includes the silicide layer 30 and the non-silicide layer 31, that the non-silicide layer 31 is connected to the interlayer insulating film 22, and that the silicide layer 30 is connected to the contact plug 25. Consequently, in a semiconductor device, the amorphous silicon layer 23 is prevented from being peeled from the interlayer insulating film 22 while reducing the interface resistance between the amorphous silicon layer 23 and the contact plug 25.

(Modification)

Figure 4A:
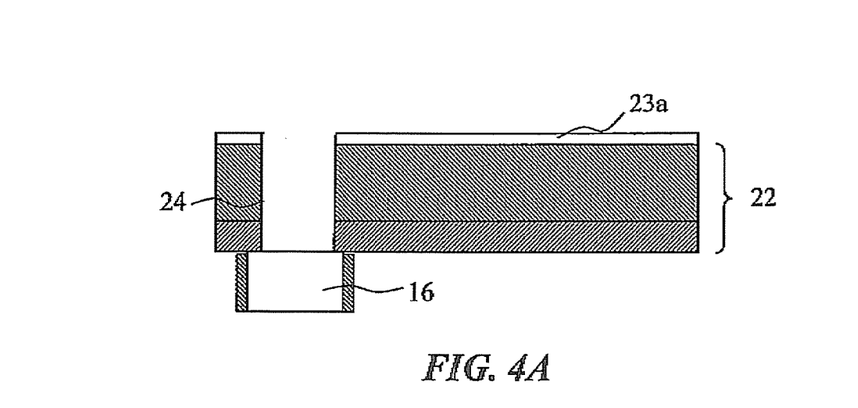
FIGS. 4A to 4C are cross-sectional views illustrating a part of a semiconductor device manufacturing method according to a modification of Embodiment 1.
Figure 4B:
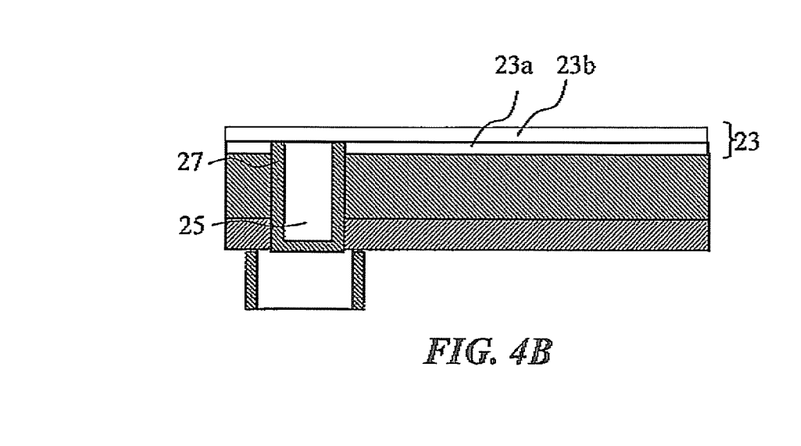
Figure 4C:
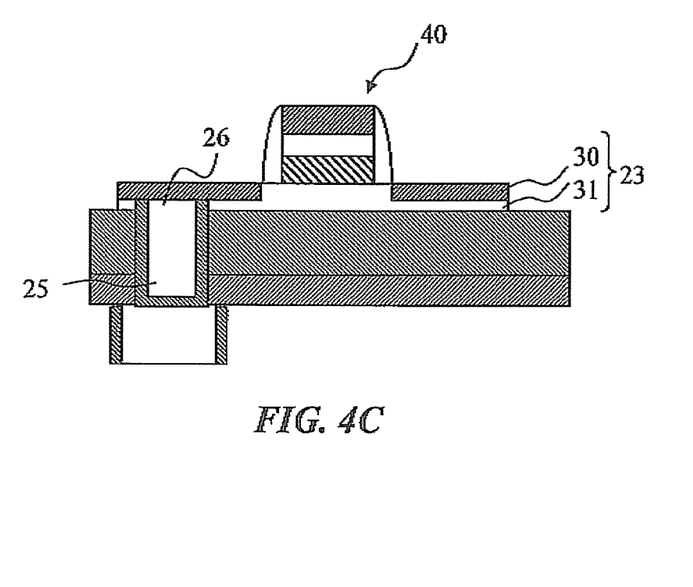

A semiconductor device manufacturing method according to a modification of Embodiment 1 is described hereinafter with reference to FIGS. 4A to 4C. FIGS. 4A to 4C are cross-sectional views illustrating a part of the semiconductor device manufacturing method according to Embodiment 1.

First, as illustrated in FIG. 4A, a thin amorphous silicon layer 23a is formed on the interlayer insulating film 22 after the interlayer insulating film 22 is formed above the logic circuit (not shown) by a conventional method. The thickness of the amorphous silicon layer 23a is, e.g., about 40 nm. Then, the through hole 24 is formed in the amorphous silicon layer 23a and the interlayer insulating film 22 by a conventional method such as a reactive ion etching (RIE) method or a lithography method.

Next, as illustrated in FIG. 4B, after the barrier metal 27 is formed in the through hole 24 by a conventional method, the contact plug 25 is formed by the CVD method to plug the through hole 24. Then, an amorphous silicon layer 23b is formed on the amorphous silicon layer 23a and the contact plug 25. The thickness of the amorphous silicon layer 23b is, e.g., about 15 nm to 30 nm. Thus, the protrusion portion 26 of the contact plug 25 is formed, and the amorphous silicon layer 23 has the amorphous silicon layers 23a and 23b.

Next, as illustrated in FIG. 4C, a TFT is formed on the amorphous silicon layer 23 by a conventional method such as the CVD method or the lithography method. Then, the amorphous silicon layer 23 is silicided from the top-part thereof to a predetermined depth. At that time, the film thickness of a metal (e.g., nickel (Ni), titanium (Ti), or cobalt (Co)) to be sputtered is adjusted. Thus, the amorphous silicon layer 23 can be silicided from the top-part thereof to the predetermined depth. Consequently, the top-part of the amorphous silicon layer 23 is silicided into the silicide layer 30, while the bottom-part thereof is remained as the non-silicide layer 31. Accordingly, the silicide layer 30 is connected to the protrusion portion 26 of the contact plug 25.

Embodiment 2

Figure 5:
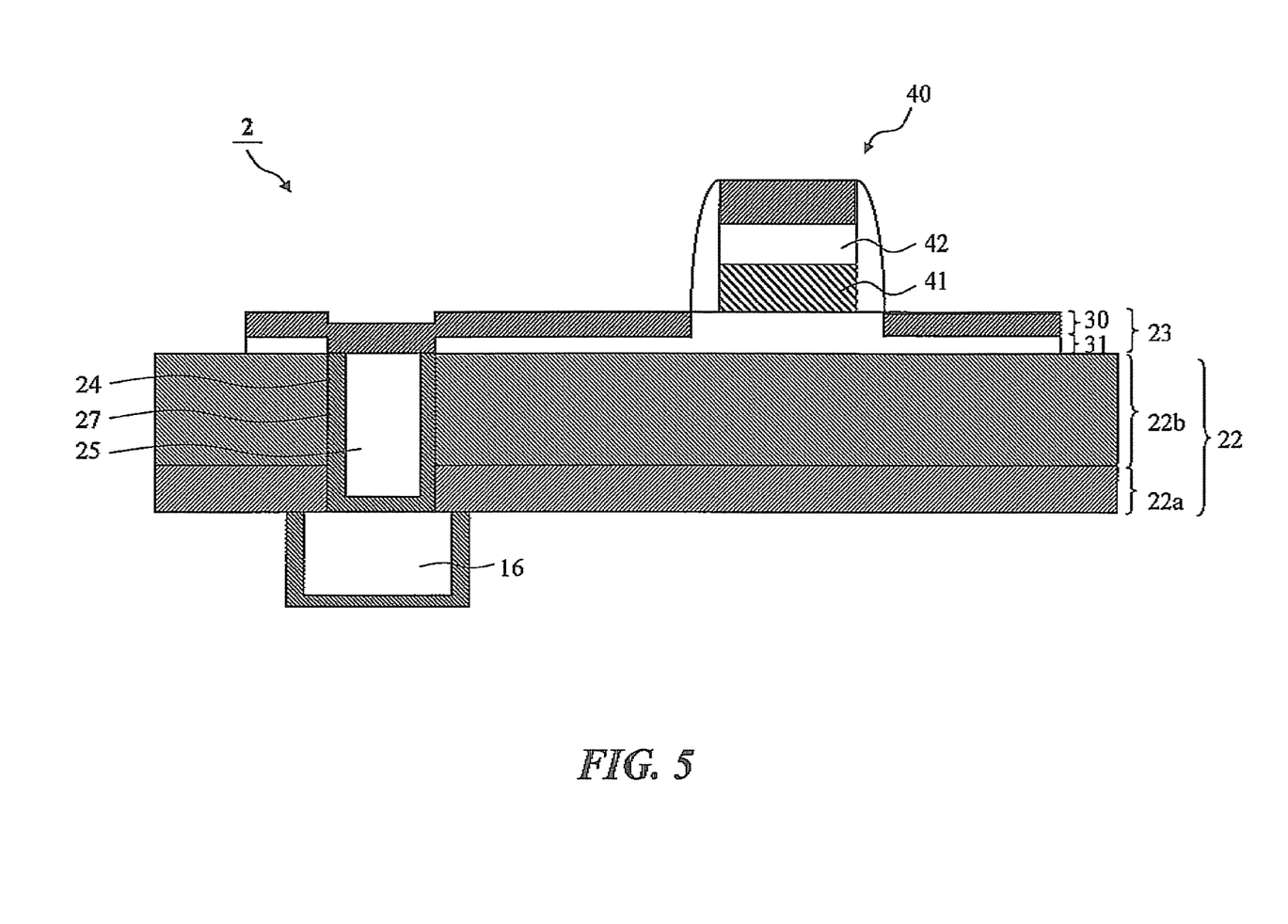
FIG. 5 is a cross-sectional view illustrating a semiconductor device according to Embodiment 2.

Next, Embodiment 2 is described hereinafter with reference to FIG. 5. FIG. 5 is a cross-sectional view illustrating a semiconductor device according to Embodiment 2. Each component thereof, which is the same as or similar to an associated component of Embodiment 1, is designated with the same reference numeral as that designating the associated component of Embodiment 1. The description for such components is omitted.

Similarly to the semiconductor device 1 according to Embodiment 1, in a semiconductor device 2 according to Embodiment 2, the amorphous silicon layer 23 includes the silicide layer 30 and the non-silicide layer 31, and the non-silicide layer 31 is contacted with the interlayer insulating film 22.

The semiconductor device 2 according to the present embodiment differs from that according to Embodiment 1 in the configurations of the contact plug 25 and the amorphous silicon layer 23 formed on the contact plug 25.

The contact plug 25 is formed to plug the through hole 24 penetrating the interlayer insulating film 22. In the amorphous silicon layer 23 formed on the interlayer insulating film 22, the top-part is silicided into the silicide layer 30, while the bottom-part is remained as the non-silicide layer 31. In addition, the amorphous silicon layer 23 formed on the contact plug 25 is silicided to the bottom-part thereof connected to the contact plug 25. Further, a surface of the amorphous silicon layer 23 is concaved on the contact plug 25.

With the above configuration, the semiconductor device 2 according to Embodiment 2 can have advantages similar to those of the semiconductor device 1 according to Embodiment 1.

Figure 6A:
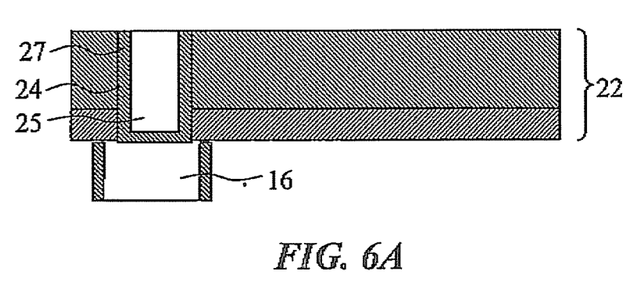
FIGS. 6A to 6C are cross-sectional views illustrating a part of a semiconductor device manufacturing method according to Embodiment 2.
Figure 6B:
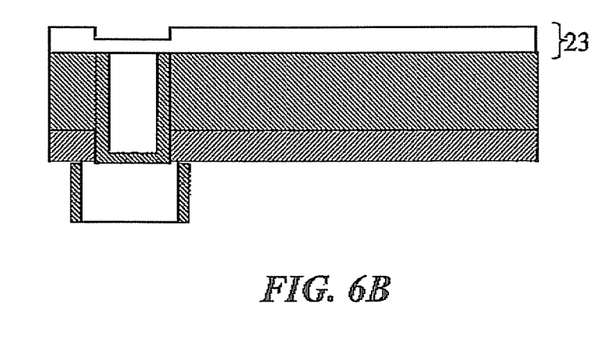
Figure 6C:
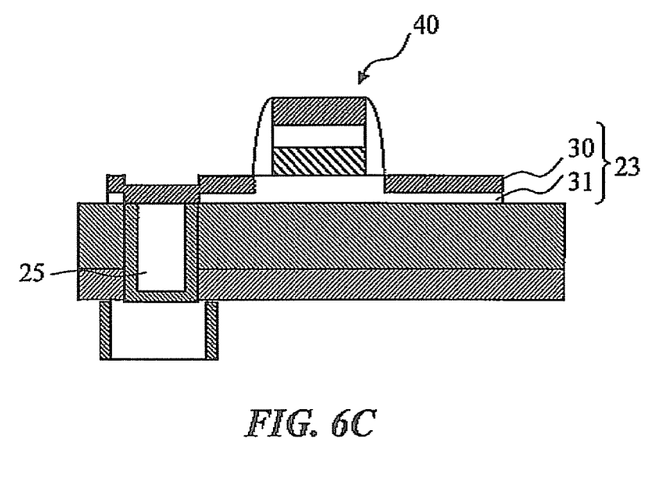

Next, a semiconductor device manufacturing method according to Embodiment 2 is described hereinafter with reference to FIGS. 6A to 6C. FIGS. 6A to 6C are cross-sectional views each illustrating a part of the semiconductor device manufacturing method according to Embodiment 2. A step illustrated in FIG. 6A is similar to that illustrated in FIG. 3A. Thus, the description thereof is omitted.

As illustrated in FIG. 6B, the amorphous silicon layer 23 is formed on the interlayer insulating film 22 and the contact plug 25. The thickness of the amorphous silicon layer 23 formed in a step illustrated in FIG. 6B is, e.g., about 50 nm to 60 nm. Then, the amorphous silicon layer 23 formed on the contact plug 25 is etched by a conventional method such as the PIE method or the lithography method. Consequently, the amorphous silicon layer 23 is formed thin on the contact plug 25, as compared with on the interlayer insulating film 22.

Next, as illustrated in FIG. 6C, a TFT is formed on the amorphous silicon layer 23 by a conventional method such as the CVD method or the lithography method. Then, the amorphous silicon layer 23 is silicided from the top-part thereof to a predetermined depth. Consequently, in the amorphous silicon layer 23 formed on the interlayer insulating film 22, the top-part is silicided into the silicide layer 30, while the bottom-part is remained as the non-silicide layer 31. In addition, the amorphous silicon layer 23 on the contact plug 25 is silicided so that the bottom-part thereof is connected to the contact plug 25.

Embodiment 3

Figure 7:
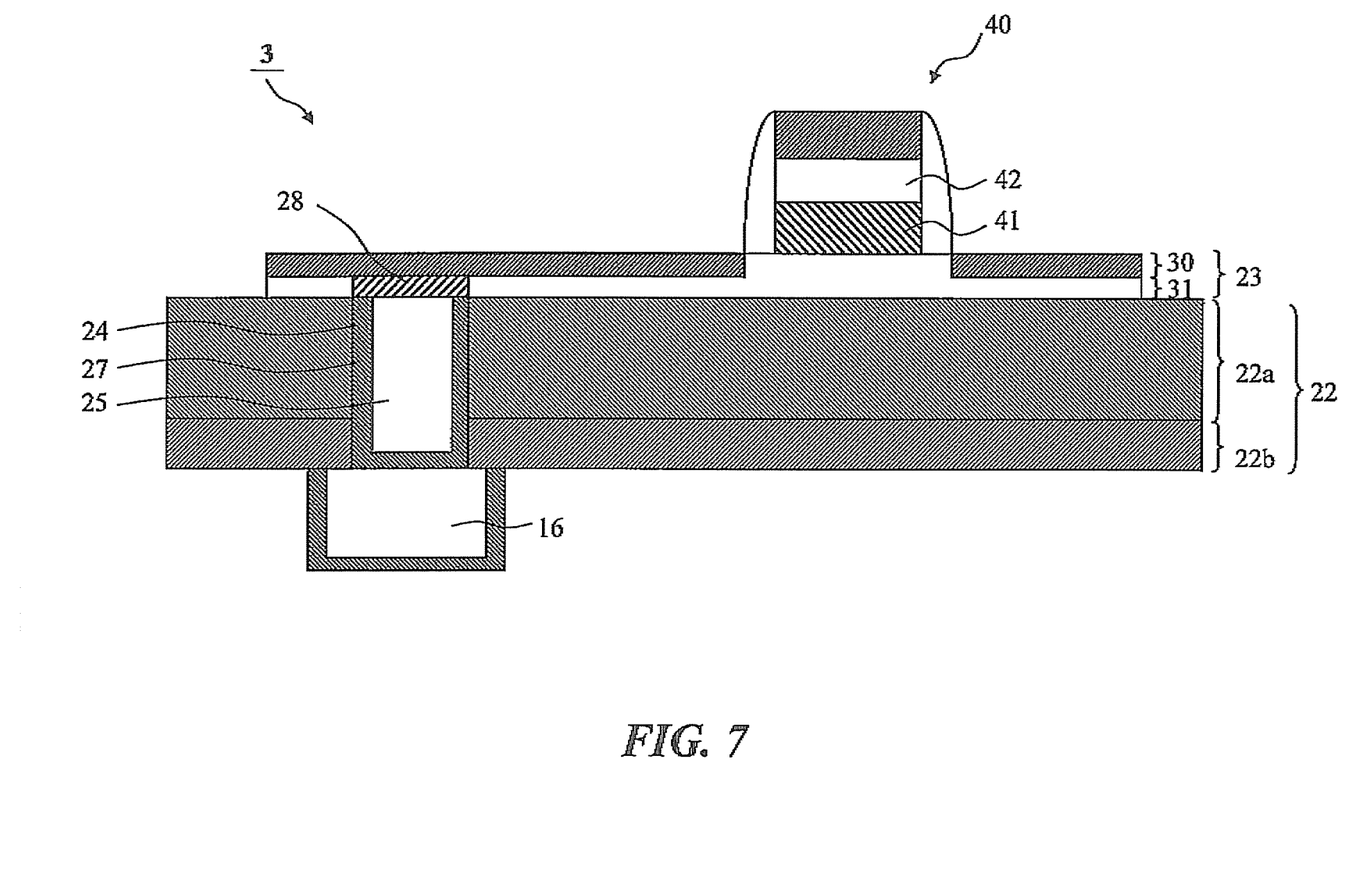
FIG. 7 is a cross-sectional view illustrating a semiconductor device according to Embodiment 3.

Next, Embodiment 3 is described hereinafter with reference to FIG. 7. FIG. 7 is a cross-sectional view illustrating a semiconductor device according to Embodiment 3. Each component thereof, which is the same as or similar to an associated component of Embodiment 1, is designated with the same reference numeral as that designating the associated component of Embodiment 1. The description for such components is omitted.

Similarly to the semiconductor device 1 according to Embodiment 1, in a semiconductor device 3 according to Embodiment 3, the amorphous silicon layer 23 includes the silicide layer 30 and the non-silicide layer 31, and the non-silicide layer 31 is contacted with the interlayer insulating film 22.

The semiconductor device 3 according to the present embodiment differs from that according to Embodiment 1 in the configurations of the contact plug 25 and the amorphous silicon layer 23 formed on the contact plug 25.

In the amorphous silicon layer 23 formed on the interlayer insulating film 22, the top-part is silicided into the silicide layer 30, while the bottom-part is remained as the non-silicide layer 31. The contact plug 25 is formed to plug the through hole 24 penetrating the interlayer insulating film 22. On a top-part of the contact plug 25, a contact plug silicide layer 28 which is silicided is formed. The contact plug silicide layer 28 protrudes from the interlayer insulating film 22 to be connected to the silicide layer 30.

With the above configuration, the semiconductor device 3 according to Embodiment 3 can have advantages similar to those of the semiconductor device 1 according to Embodiment 1.

Figure 8A:
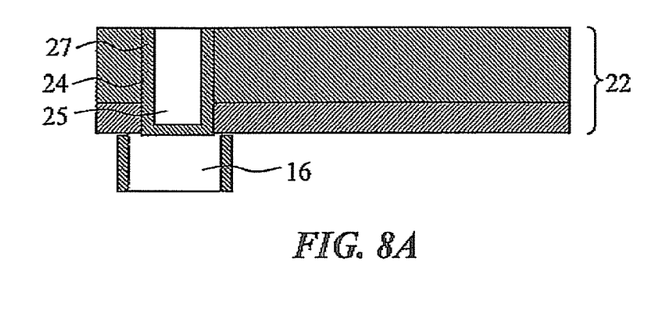
FIGS. 8A to 8C are cross-sectional views illustrating a part of a semiconductor device manufacturing method according to Embodiment 3.
Figure 8B:
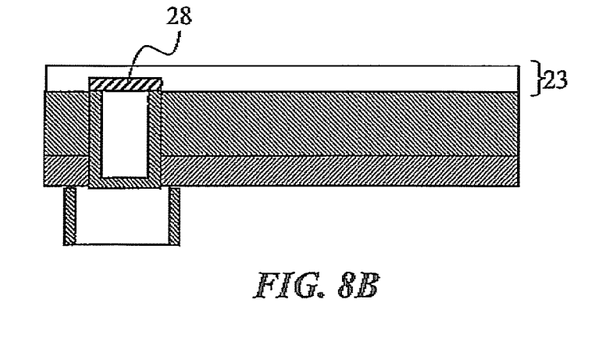
Figure 8C:
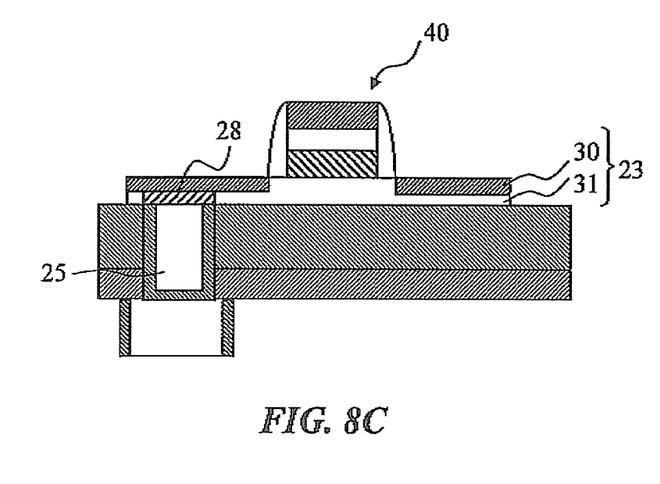

Next, a semiconductor device manufacturing method according to the present embodiment is described hereinafter with reference to FIGS. 8A to 8C. FIGS. 8A to 8C are cross-sectional views illustrating a part of the semiconductor device manufacturing method according to Embodiment 3. A step illustrated in FIG. 8A is similar to that illustrated in FIG. 3A. Thus, the description thereof is omitted.

As illustrated in FIG. 8B, a layer of metal, such as Ni, Co or W, is selectively formed on the contact plug 25 and the barrier metal 27 by a conventional technique such as sputtering or lithography. Consequently, a contact plug silicide layer 28 is formed on the contact plug 25 and the barrier metal 27. Then, the amorphous silicon layer 23 is formed on the interlayer insulating film 22 and the contact plug silicide layer 28. The thickness of the amorphous silicon layer 23 is, e.g., about 50 nm to 60 nm.

Next, as illustrated in FIG. 8C, a TFT is formed on the amorphous silicon layer 23 by a conventional method, such as the CVD method, or the lithography method. Then, the amorphous silicon layer 23 is silicided from the top-part thereof to a predetermined depth. At that time, the film thickness of a metal (e.g., Ni, Ti, or Co) to be sputtered is adjusted. Thus, the amorphous silicon layer 23 can be silicided from the top-part thereof to the predetermined depth. Consequently, the top-part of the amorphous silicon layer 23 is silicided into the silicide layer 30, while the bottom-part thereof is remained as the non-silicide layer 31. Accordingly, the silicide layer 30 is connected to the contact plug silicide layer 28.

Embodiment 4

Figure 9:
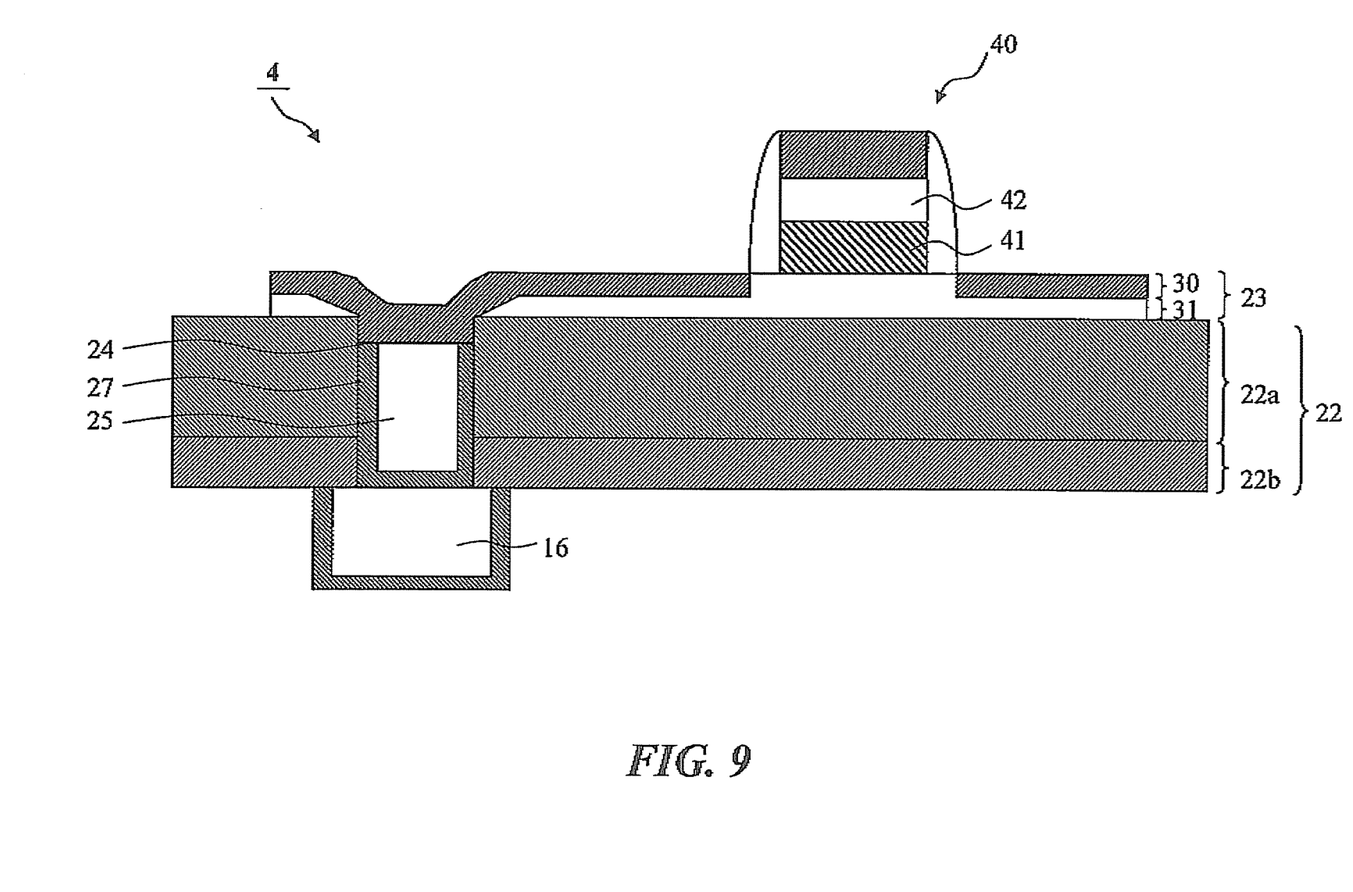
FIG. 9 is a cross-sectional view illustrating a semiconductor device according to Embodiment 4.

Next, Embodiment 4 is described hereinafter with reference to FIG. 9. FIG. 9 is a cross-sectional view illustrating a semiconductor device according to Embodiment 4. Each component thereof, which is the same as or similar to an associated component of Embodiment 1, is designated with the same reference numeral as that designating the associated component of Embodiment 1. The description for such components is omitted.

Similarly to the semiconductor device 1 according to Embodiment 1, in a semiconductor device 4 according to Embodiment 4, the amorphous silicon layer 23 includes the silicide layer 30 and the non-silicide layer 31, and the non-silicide layer 31 is contacted with the interlayer insulating film 22.

The semiconductor device 4 according to the present embodiment differs from that according to Embodiment 1 in the configurations of the contact plug 25 and the amorphous silicon layer 23 formed on the contact plug 25.

The through hole 24 is formed to penetrate the interlayer insulating film 22, and the contact plug 25 is formed to plug a part of the through hole 29. That is, the contact plug 25 has a predetermined height from the bottom of the through hole 24. The amorphous silicon layer 23 is formed on the contact plug 25 to plug a remaining part of the through hole 24. In addition, a portion of the amorphous silicon layer 23, which extends on the interlayer insulating film 22, is divided into the upper-part silicided as the silicide layer 30 and the lower-part left not silicided as the non-silicide layer 31. A portion of the amorphous silicon layer 23, which plugs the through hole 24, is silicided and connected to the above-mentioned silicide layer 30 of the amorphous silicon layer 23.

With the above configuration, the semiconductor device 4 according to Embodiment 4 can have advantages similar to those of the semiconductor device 1 according to Embodiment 1.

Figure 10A:
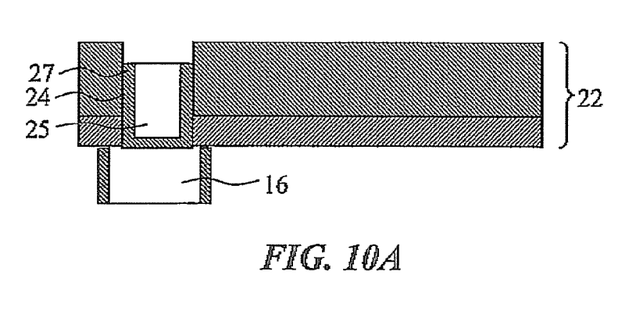
FIGS. 10A to 10C are cross-sectional views illustrating a part of a semiconductor device manufacturing method according to Embodiment 4.
Figure 10B:
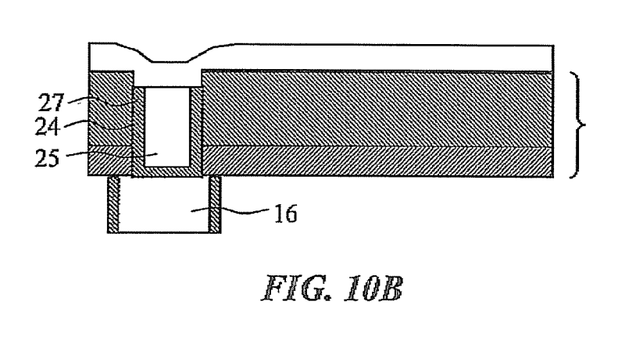
Figure 10C:
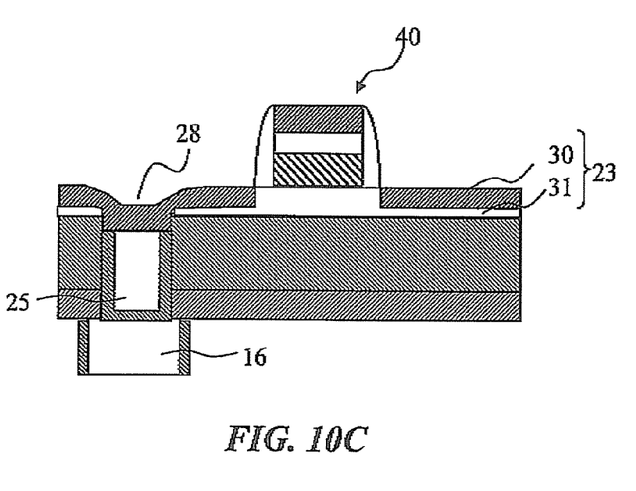

Next, a semiconductor device manufacturing method according to the present embodiment is described hereinafter with reference to FIGS. 10A to 10C. FIGS. 10A to 10C are cross-sectional views illustrating a part of the semiconductor device manufacturing method according to Embodiment 4.

First, as illustrated in FIG. 10A, the through hole 24 is formed in the interlayer insulating film 22 to penetrate therethrough and to expose the wiring 16 at the bottom thereof, after the interlayer insulating film 22 is formed above the logic circuit (not shown) by a conventional method. Next, after the barrier metal 27 is formed in the through hole 24 by a conventional method, the contact plug 25 is formed by the CVD method to plug the through hole 24. Then, the interlayer insulating film 22 and the barrier metal 27 are planarized by the CMP method. After that, the contact plug 25 is selectively etched by wet-etching or dry-etching to a predetermined depth from the top-part thereof. Consequently, the contact plug 25 is concaved with respect to the interlayer insulating film 22.

Next, as illustrated in FIG. 10B, the amorphous silicon layer 23 is formed on the interlayer insulating film 22 and the contact plug 25. The thickness of the amorphous silicon layer 23 formed in this stage is, e.g., about 50 nm to 60 nm. At that time, the amorphous silicon layer 23 formed on the contact plug 25 is partially plugged into the through hole 24. Consequently, a surface of the amorphous silicon layer 23 is concaved.

Next, as illustrated in FIG. 10C, a TFT is formed on the amorphous silicon layer 23 by a conventional method, such as the CVD method, or the lithography method. Then, the amorphous silicon layer 23 is silicided from the top-part thereof to a predetermined depth. Consequently, on the interlayer insulating film 22, the amorphous silicon layer 23 is divided into the top-part silicided as the silicide layer 30 and the bottom-part remained as the non-silicide layer 31. And, on the contact plug 25, the amorphous silicon layer 23 is silicided to the bottom-part to be connected to the contact plug 25.

The above embodiments are exemplified for explaining the invention, and not intended to be interpreted to limit the invention. The invention includes equivalents thereof, and can be changed/improved without departing from the scope of the invention.

The invention claimed is:

1. A semiconductor device, comprising:
a logic circuit;
an interlayer insulating film formed above the logic circuit, the interlayer insulating film having a through hole penetrating therethrough;
a contact plug embedded in the through hole, a top face of the contact plug being flush with a top face of the interlayer insulating film, the contact plug being electrically connected to the logic circuit;
an amorphous silicon layer formed on the interlayer insulating film to have a recess at a position corresponding to the contact plug, a top part of the amorphous silicon layer is silicided into a silicide layer while leaving a lower part thereof as a non-silicide layer; and
a TFT formed on the amorphous silicon layer,
wherein a bottom face of the silicide layer at the recess reaches the top face of the contact plug.

2. The device of claim 1,
wherein a thickness of the amorphous silicon layer at the recess is thinner than that at the other portion.

3. A semiconductor device, comprising:
a logic circuit;
an interlayer insulating film formed above the logic circuit, the interlayer insulating film having a through hole penetrating therethrough;
a contact plug embedded in the through hole, a top face of the contact plug being flush with a top face of the interlayer insulating film, the contact plug being electrically connected to the logic circuit;
a metal layer formed on the top face of the contact plug;
an amorphous silicon layer formed on the interlayer insulating film to cover the metal layer, a top part of the amorphous silicon layer is silicided into a silicide layer while leaving a lower part thereof as a non-silicide layer; and
a TFT formed on the amorphous silicon layer,
wherein a bottom face of the silicide layer reaches a top face of the metal layer.

4. The device of claim 3,
wherein the top face of the metal layer contacts the silicide layer, while a side face thereof contacts the non-silicide layer.

5. A semiconductor device, comprising:
a logic circuit;
an interlayer insulating film formed above the logic circuit;
an amorphous silicon layer comprising:
a non-silicide layer formed on the interlayer insulating film; and
a silicide layer formed on the non-silicide layer;
a TFT formed on the amorphous silicon layer; and
a contact plug formed to plug a through hole penetrating the interlayer insulating film, the contact plug being electrically connected to the logic circuit, an upper part of the contact plug being connected to the silicide layer;
wherein the contact plug plugs a part of the through hole to have a predetermined height,
wherein the amorphous silicon layer plugs a remaining part of the through hole above the contact plug, and
wherein, on the contact plug, the amorphous silicon is silicided into the silicide layer to reach the contact plug.

6. The device of claim 5,
wherein a height of the amorphous silicon layer on the contact plug is lower than that on the interlayer insulating film.

7. A semiconductor device manufacturing method, comprising:
forming a contact plug in a through hole that is formed in an interlayer insulating film provided on a logic circuit;
forming an amorphous silicon layer on the interlayer insulating film and on the contact plug;
selectively etching the amorphous silicon layer on the contact plug to a predetermined height; and siliciding the amorphous silicon layer from a top-part thereof to a predetermined depth.

\* \* \* \* \*